US007378854B2

(12) United States Patent
Xu

(10) Patent No.: US 7,378,854 B2
(45) Date of Patent: May 27, 2008

(54) DUAL SINE-WAVE TIME STAMP METHOD AND APPARATUS

(75) Inventor: Fang Xu, Newton, MA (US)

(73) Assignee: Teradyne, Inc., North Reading, MA (US)

( * ) Notice: Subject to any disclaimer, the term of this patent is extended or adjusted under 35 U.S.C. 154(b) by 85 days.

(21) Appl. No.: 11/261,897

(22) Filed: Oct. 28, 2005

(65) Prior Publication Data

US 2007/0100570 A1 May 3, 2007

(51) Int. Cl.
*G01R 27/28* (2006.01)
*G01R 25/00* (2006.01)

(52) U.S. Cl. ................ 324/617; 324/76.78; 324/76.62

(58) Field of Classification Search ................ 324/617, 324/76.78, 76.62, 76.39
See application file for complete search history.

(56) References Cited

U.S. PATENT DOCUMENTS 3,363,183 A 1/1968 Bowling et al. .............. 328/63
3,471,790 A 10/1969 Kaps ........................... 328/63
3,612,906 A 10/1971 Kennedy .................... 307/269
3,947,697 A 3/1976 Archer et al. ............... 307/208
4,119,910 A 10/1978 Hayashi ..................... 324/83 R
4,488,108 A 12/1984 Treise et al. .............. 324/83 D
4,574,234 A * 3/1986 Inbar ........................ 324/76.24
4,607,218 A * 8/1986 Stosel ...................... 324/76.82
4,686,458 A 8/1987 Beyerbach et al. ....... 324/83 D
5,003,194 A 3/1991 Engelhard ................... 307/265
5,084,669 A 1/1992 Dent ......................... 324/83 D
5,218,289 A * 6/1993 Besson ..................... 324/76.78
5,258,968 A 11/1993 Matsuda et al. ......... 369/44.35
5,293,079 A 3/1994 Knoch ........................ 307/234
5,321,700 A 6/1994 Brown et al. ................. 371/27
5,381,100 A 1/1995 Hayashi ...................... 324/601
5,420,831 A 5/1995 Muirhead
5,471,136 A * 11/1995 Pye .......................... 324/158.1

(Continued)

FOREIGN PATENT DOCUMENTS

EP 0772201 A2 5/1997

(Continued)

OTHER PUBLICATIONS

PCT International Search Report and Written Opinion of the International Searching Authority for International Application No. PCT/US2006/041743, dated Jul. 10, 2007, 14 pages.

*Primary Examiner*—Andrew H. Hirshfeld
*Assistant Examiner*—Amy He
(74) *Attorney, Agent, or Firm*—Ralph Trementozzi; Foley & Lardner LLP

(57) ABSTRACT

A time of an event can be determined by acquiring an amplitude, at the time of the event, of at least two periodic timing signals that are out of phase with each other. The time of the event within a cycle of at least one of the timing signals can be determined as a function of the amplitudes of the timing signals. The phase angle and complex coordinates of at least one of the timing signals can be determined as a function of the amplitudes. The time of the event within a cycle of a timing signal can be determined as a function of the phase angle or complex coordinates of the timing signal at the time of the event.

23 Claims, 5 Drawing Sheets

U.S. PATENT DOCUMENTS

| | | | | |
|---|---|---|---|---|
| 5,568,071 | A | 10/1996 | Hoshino et al. | 377/43 |
| 5,886,660 | A * | 3/1999 | Loewenstein | 341/166 |
| 6,233,528 | B1 | 5/2001 | Lai et al. | 702/69 |
| 6,291,981 | B1 | 9/2001 | Sartschev | 324/76.82 |
| RE37,716 | E * | 5/2002 | Sutardja et al. | 341/120 |
| 6,437,589 | B1 | 8/2002 | Sugano | 324/763 |
| 6,735,543 | B2 | 5/2004 | Douskey et al. | 702/120 |

FOREIGN PATENT DOCUMENTS

| | | |
|---|---|---|
| JP | 63085489 | 4/1988 |
| JP | 08122465 | 5/1996 |
| WO | WO 2006/038559 | 4/2006 |

* cited by examiner

DUAL SINE-WAVE TIME STAMP METHOD AND APPARATUS

FIELD OF THE INVENTION

The present invention relates generally to the field of signal timing measurement.

BACKGROUND OF THE INVENTION

Testing of data communication devices and other electronic devices often involves waveform timing analysis in which it is necessary to record the exact time that an event in a waveform occurs. As the volume of data being transmitted through devices has been increasing, the speed of the signal waveforms that must be analyzed has also been increasing.

Typical time stamping circuitry counts the number of pulses received from a reference clock before an event in a waveform under test is detected. The time resolution of the counter method that is used in this type of time stamping circuitry is limited to the period of the reference clock and the maximum counting speed of the counter circuitry.

It has been known to extend time stamp resolution to less than one period of a reference clock by charging and discharging a capacitor with a reference clock and measuring the voltage of the capacitor at the time of an event. The time/discharge rate of the capacitor is generally known, so the time between a clock pulse and an event can be determined using knowledge of the capacitor voltage. However, this method suffers from some inaccuracy and requires calibration because the discharge rate of capacitors is generally non-linear and can differ significantly among capacitors.

Timing methods such as capacitive timing methods which use ramp waveforms are particularly susceptible to noise because ramp waveforms occupy a wide frequency band. This is especially true in a high density/multi-channel environment such as in test environments for digital devices. Increasing the slope of a ramp waveform can reduce noise but at the cost of higher current which increases power consumption and emissions, among other disadvantages.

SUMMARY OF THE INVENTION

Various embodiments of the present invention provide a time stamping method and apparatus that has sufficient resolution to time events between cycles of a reference clock without a need for capacitive discharge timing circuitry. A pair of periodic waveforms with a phase difference between them can be generated and each can be applied to respective track and hold circuitries. In an illustrative embodiment, the event being timed can be used to trigger a hold in the track and hold circuitry for each of the waveforms. The track and hold circuitry can then hold the amplitude of each waveform at the time of the event.

In an illustrative embodiment, because amplitude pairs will have a direct relationship with phase angles for the waveforms, the pair of amplitudes held in the track and hold circuitries can be used to identify the phase angles of the periodic waveforms. Because the phase angles of the periodic waveforms will have a direct relationship to the time within a cycle of the waveform, the phase angles can be used to identify the time of an event within a cycle of the waveform. The cycles of one or both of the periodic waveforms can be counted and added to the time within a cycle to determine the time the event occurred with high resolution.

An illustrative embodiment of the present invention provides a method for determining the time of an event by generating at least two timing signals with different phase angles and acquiring the amplitude of each of the timing signals at the time of the event. According to the illustrative embodiment, the time of the event within a cycle of a timing signal can be determined as a function of the amplitudes of at least two of the timing signals at the time of the event. In an illustrative embodiment, the phase angle of at least one of the timing signals can be determined as a function of the amplitude of at least two of the timing signals. The time of the event within a cycle of a timing signal can be determined as a function of the phase angle of the timing signal at the time of the event.

Another illustrative embodiment of the present invention provides a method for time stamping an event in a signal by applying a first periodic signal to first track and hold circuitry and applying a second periodic signal to second track and hold circuitry, wherein the second periodic signal is about 90 degrees out of phase with the first periodic signal. According to the illustrative embodiment, a signal including the event being time stamped is applied to the first and second track and hold circuitry to trigger the first and second track and hold circuitry with the event.

In the illustrative embodiments, a phase angle of the first and/or second periodic signal can be determined according to the amplitude stored in the first and second track and hold circuitry. A time within a cycle of the first and/or second periodic signal that the event occurred can be determined according to the phase angle of the first periodic signal and/or second periodic signal. A cycle count of the first and/or second periodic signal can also be determined and combined with the time within a cycle to generate a time stamp of the event.

Another illustrative embodiment of the present invention provides an apparatus for providing a time stamp of an event including a timing signal source in communication with first track and hold circuitry and in communication with second track and hold circuitry. The timing signal source can provide a first timing signal and a second timing signal which is out of phase with the first timing signal. The illustrative embodiment includes a test signal input in communication with the first and second track and hold circuitry such that events to be time-stamped in the test signal are provided as a trigger signal to the first and second track and hold circuitry. A processor in communication with the first and second track and hold circuitry can be designed according to the illustrative embodiment to determine a phase angle and/or complex coordinates of at least one of the first and second timing signals at the time of the event as a function of the amplitude of the first and second timing signal.

BRIEF DESCRIPTION OF THE DRAWINGS

The present invention will be more fully understood from the following detailed description of illustrative embodiments taken in conjunction with the accompanying drawings in which.

DETAILED DESCRIPTION

Figure 1:
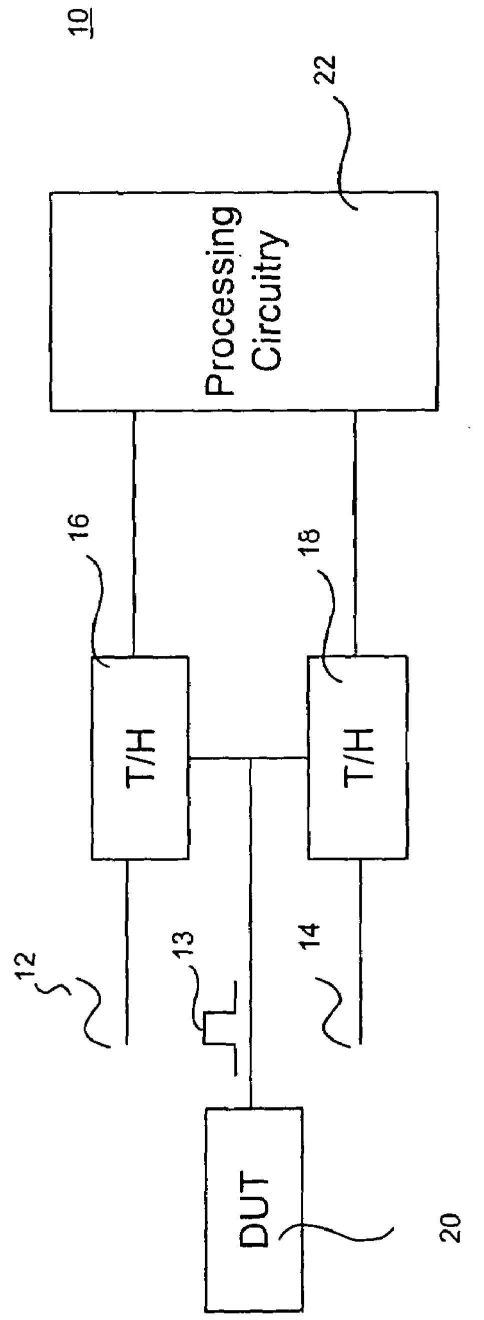
FIG. 1 is a schematic block diagram of a time stamping circuit using a pair of periodic waveforms and corresponding track and hold circuitry according to an illustrative embodiment of the present invention.

An apparatus according to an illustrative embodiment of the invention for identifying the time of an event in a signal with precision that is not limited by the period of a timing signal is described generally with reference to FIG. 1. It should be understood by persons having ordinary skill in the art that the amplitude of a periodic timing signal, such as a sine wave, for example, is a function of phase angle and a function of time, but the inverse is not true. For example, in a periodic timing signal, neither time nor phase angle are a function of amplitude, i.e., they do not have a 1:1 signal space to time relationship because there are two times and phase angles in each period of a periodic signal which correspond to particular amplitude. Accordingly, it is necessary to acquire more than just one timing signal amplitude in order to determine the phase angle of the timing signal. Various illustrative embodiments of the present invention may achieve a 1:1 signal space to time relationship by simultaneously detecting the amplitude of both of a pair of periodic timing signals that are out of phase with each other.

According to an illustrative embodiment of the invention, a first timing signal 12 is applied to first track and hold circuitry 16. A second timing signal 14 is applied to second track and hold circuitry 18. In the illustrative embodiment, the timing signals are periodic signals having phase angles that vary as a function of time. An event 13, such as a pulse in a signal from a device under test 20, for example, is applied to the first track and hold circuitry 16 and second track and hold circuitry 18. In the illustrative embodiment, processing circuitry 22 is provided in communication with the first and second track and hold circuitries 16, 18.

The event 13 triggers the first and second track and hold circuitries 16, 18 to hold the amplitude of the first and second timing signals 12, 14 at the time of the event 13 and to provide the amplitude of each of the first and second timing signals 12, 14 at the time of the event 13 to the processing circuitry 22. The processing circuitry 22 receives from the first and second track and hold circuitries 16, 18, a pair of signals or data values representing the amplitude of the first and second timing signals 12, 14 at the time of the event 13. There should be a direct relationship between the pair of amplitudes and the phase angles of first and second timing signals. In the various illustrative embodiments, this direct relationship can result from the timing signals having the same frequency such as, for example, wherein a second timing signal is derived as a phase shifted copy of the first timing signal. Persons having ordinary skill in the art should appreciate that other method of providing a direct relationship between a pair of amplitudes and phase angles of timing signals can be provided within the scope of the present invention, for example, by coordinating phase angles between the first and second timing signals.

In the illustrative embodiment of the present invention, the processing circuitry 22 determines the phase angle that corresponds to the amplitude pair of the first and second timing signals by using a mathematical formula or look-up table. The processing circuitry can then compute the time of the event within a period of the first and/or second timing signals. It should be understood by persons having ordinary skill in the art that the correspondence between a pair of timing signal amplitudes and the phase angles of the timing signals can be embodied in a mathematical formula or a look-up table.

Once the time of an event within a period of a timing signal is known, the time of the event relative to a start time can be determined by adding the time from the start time to the start of the timing signal cycle within which the event occurred to the time of the event within the timing signal cycle. It should be understood that the term "time stamping" is used herein interchangeably with "determining the time of an event" and that "time stamping" as described within the scope of the present invention is not limited to determining a time within a cycle, determining a time of an event from a start time, or recording the time of an event once it is determined. An apparatus for detecting the time of an event relative to a start time according to an illustrative embodiment of the invention is described with reference to FIG. 2.

Figure 2:
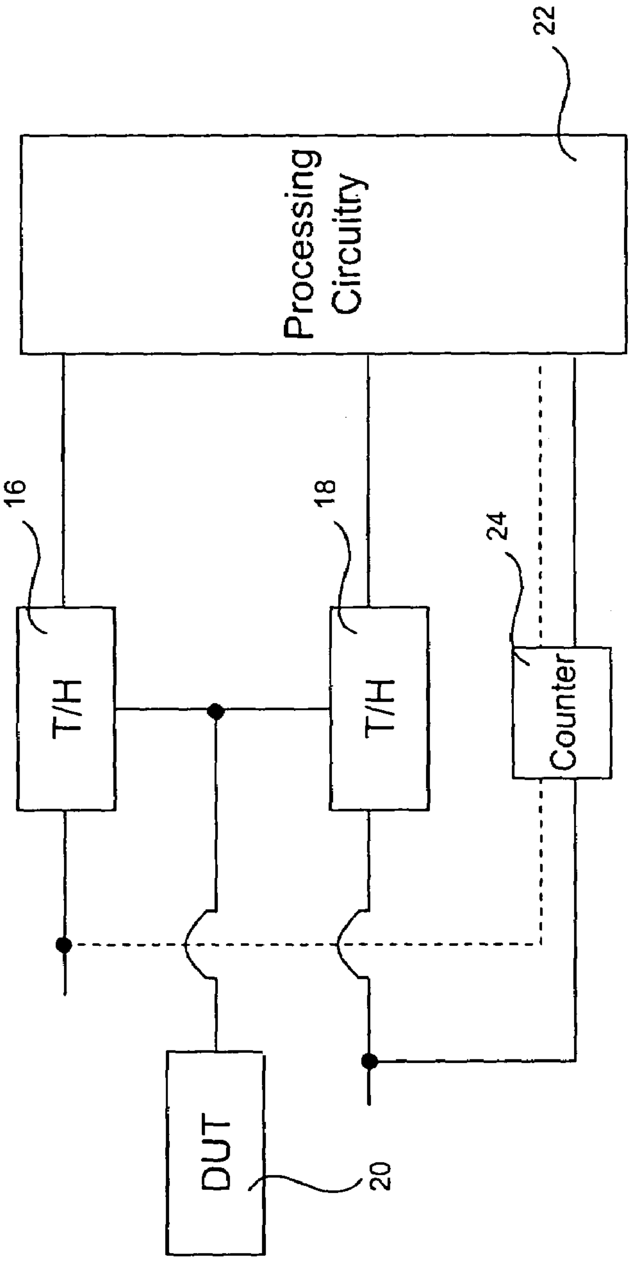
FIG. 2 is a schematic block diagram of a time stamping circuit using periodic waveforms, corresponding track and hold circuitry and a pulse counter according to an illustrative embodiment of the present invention.

The apparatus described with reference to FIG. 2 is similar to the apparatus of FIG. 1 and includes the addition of counter circuitry 24 in communication with the trigger input 15. The counter circuitry 24 is also in communication with the processing circuitry 22.

In the illustrative embodiment, the counter circuitry 24 receives the first timing signal 12 and/or the second timing signal 14 and counts the cycles thereof. The counter circuitry 24 provides a signal representing the cycle count relative to a start time of the first timing signal 12 and/or second timing signal 14 to the processing circuitry 22. The processor circuitry 22 can multiply the cycle count by the period of the timing signals to determine a time between the start time and the period of the first and/or second timing signal 12, 14 in which the event occurred. The processing circuitry can then combine the time to a timing signal cycle as computed from counter information with the time within the timing signal cycle as determined from the timing signal amplitude pair to compute the precise time of an event relative to the start time.

Persons having ordinary skill in the art should appreciate that it is not necessary to have two separate timing signal sources to generate a first timing signal 12 and a second timing signal 14 which are out of phase relative to each other. An apparatus according to an illustrative embodiment of the invention that uses one signal source to provide both the first and second timing signals is described with reference to FIG. 3.

Figure 3:
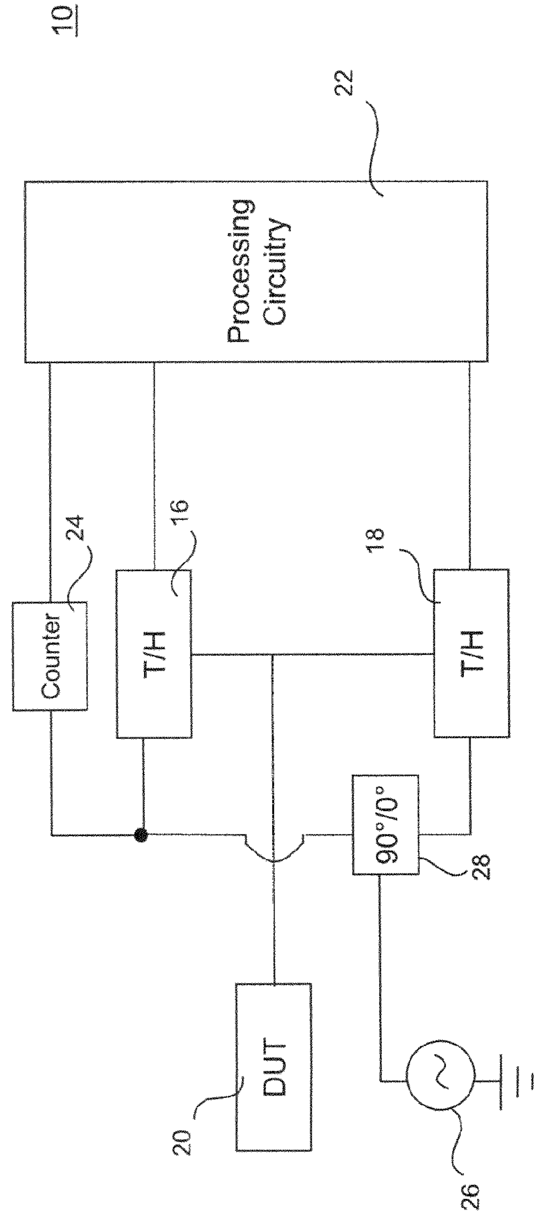
FIG. 3 is a schematic block diagram of a time stamping circuit using periodic waveforms, phase shifting circuitry, corresponding track and hold circuitry and a pulse counter according to an illustrative embodiment of the present invention.

The apparatus of FIG. 3 is similar to the apparatus of FIG. 2 and includes phase shifting circuitry 28 in communication with a timing signal source 26. The phase shifting circuitry is also in communication with the first and second track and hold circuitry 16, 18.

In an illustrative embodiment of the invention, the timing signal source 26 provides a periodic timing signal, such as a sine wave, for example, to phase shifting circuitry 28. The phase shifting circuitry 28 provides a copy of the periodic timing signal directly to either the first track and hold circuitry 16 or second track and hold circuitry 18 and provides a phase shifted copy of the periodic timing signal to the other of the first track and hold circuitry 16 or second track and hold circuitry 18. In a particular illustrative embodiment, the periodic timing signal is a sine wave, and the copy of the timing signal is phase shifted by about 90 degrees. Persons having ordinary skill in the art should understand that phase shifting circuitry 28 can be provided by numerous circuitries, such as, for example, by delay elements or delay circuitry which receives a periodic timing signal and provides a delayed copy thereof.

Persons having ordinary skill in the art should understand that the track and hold circuitry as described herein with respect to illustrative embodiments of the present invention may receive a timing signal which may be an analog signal such as a sine wave. While the invention is not so limited, the processing circuitry 22 can typically be most efficiently implemented using digital signal processing components. Accordingly, an illustrative embodiment of the invention is described with reference to FIG. 4 which includes analog-to-digital conversion circuitry disposed between the track and hold circuitry 16, 18 and the processing circuitry 22.

Figure 4:
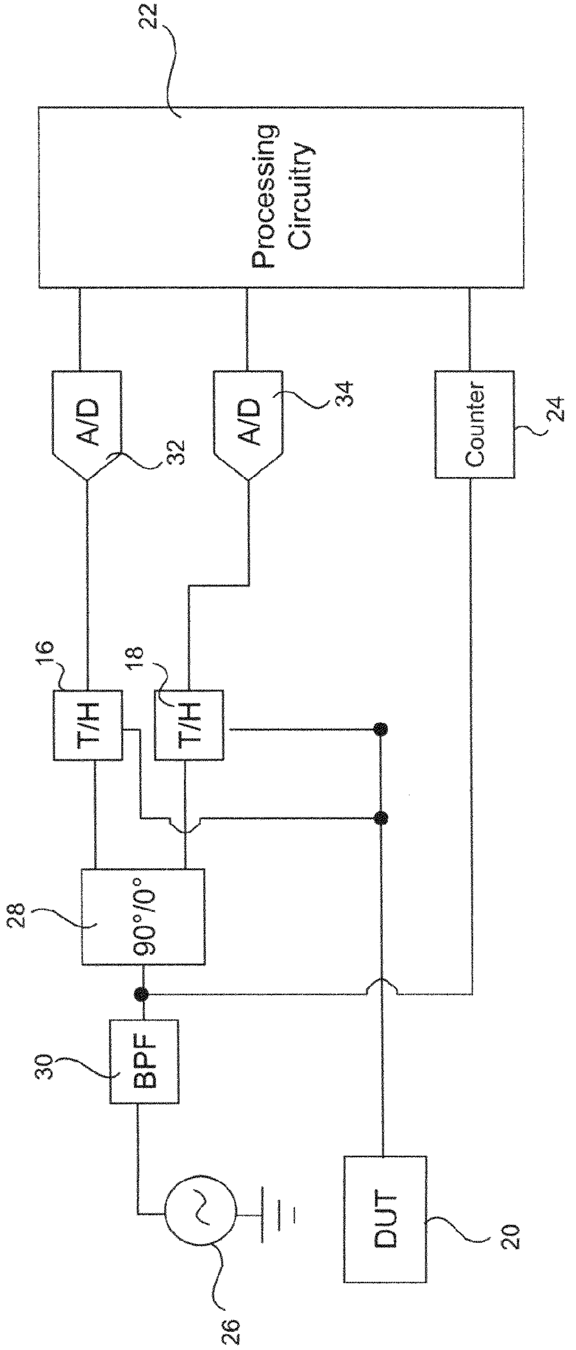
FIG. 4 is a schematic block diagram of a time stamping circuit using periodic waveforms, a band pass filter, phase shifting circuitry, corresponding track and hold circuitry, analog to digital conversion circuitry and a pulse counter according to an illustrative embodiment of the present invention.

The apparatus described with reference to FIG. 4 is similar to the apparatus of FIG. 3 and includes analog-to-digital conversion circuitries 32, 34 in communication with first and second track and hold circuitries 16,18 respectively. The analog-to-digital conversion circuitries 32, 34 are also in communication with the processing circuitry 22. The track and hold circuitries 16, 18 provide analog signals, typically a voltages, which represents the amplitude of the timing signals at the time of the event 13 to analog-to-digital conversion circuitries 32, 34. The analog-to-digital conversion circuitries 32, 34 can use a number of well known methods to changes these analog signals to digital signals. The digital signals can be used by processing circuitry 22 such as a digital signal processor (DSP), an application-specific integrated circuit (ASIC), a field-programmable gate array (FPGA) or the like, to determine the precise time of an event as described herein.

Persons having ordinary skill in the art should understand that timing signals such as sine waves typically are non-ideal and suffer at least some distortion. This distortion can affect the relationship between the amplitude and phase of the timing signals and thereby inject error into timing measurements made according to illustrative embodiments of the present invention. The illustrative embodiment of the present invention described with reference to FIG. 4, includes a filter 30 such as a band pass filter, for example, which is designed to reduce distortion in the timing signal. In the illustrative embodiment, the filter 30 receives a timing signal from a timing signal source 26, filters the timing signal and provides filtered timing signals to the track and hold circuitries 16, 18.

Although the embodiment of the present invention that is described with reference to FIG. 4 includes a filter 30 disposed between the timing signal source 26 and the phase shifter circuitries 28, persons having ordinary skill in the art should understand that alternative embodiments can be envisioned which dispose a filter 30 for the first and second timing signal 12, 14 elsewhere in the circuitry, for example, between the phase shifting circuitry 28 and the track and hold circuitries 16, 18, without departing from the spirit and scope of the present invention.

A method for determining the time of an event such as, for example, a pulse within a digital signal, is described with reference to FIG. 5. In a timing signal sourcing step 40, a first and second timing signal are acquired or generated. The first and second timing signals are periodic signals that are out of phase with each other. In an illustrative embodiment, the first timing signal is a sine wave and the second timing signal is copy of the first timing signal that has been phase shifted by about 90 degrees.

In a tracking step 42, the amplitudes of the first and second timing signals can be tracked, for example, by track and hold circuitry as known in the art. In a hold step 44, the amplitude of the first and second timing signal can be held at the time of the event being timed, for example in track and hold circuitry that is triggered by the event.

In a phase determination step 46, the amplitudes of the first and second timing signal can be used in a mathematical formula or a look-up table to determine the phase angle of the first and/or second timing signal at the time the event being timed occurred (i.e., when it triggered the track and hold circuitry). In a time determination step 48, the phase angle of one or both of the timing signals can be used to determine the time within a cycle of the timing signal(s) at which the event occurred, for example by using the relation: time=phase angle×angular velocity, wherein angular velocity is known as a function of the known timing signal frequency.

To determine the time of the event as measured from a start time, for example, a cycle counting step 50 can also be performed in which the number of timing signal cycles are counted from the start time to the time of the event. Because the frequency and period of the timing signals are known, the pulse count can be used to calculate the time between the start time and the event, for example by using the relation: time=cycle count×period.

In a combination step 52, the time between the start time and the cycle of the timing signal within which an event occurred can be added to the time within the cycle of the timing signal at which the event occurred to determine the absolute time of the event relative to the start time with high precision.

Figure 6:
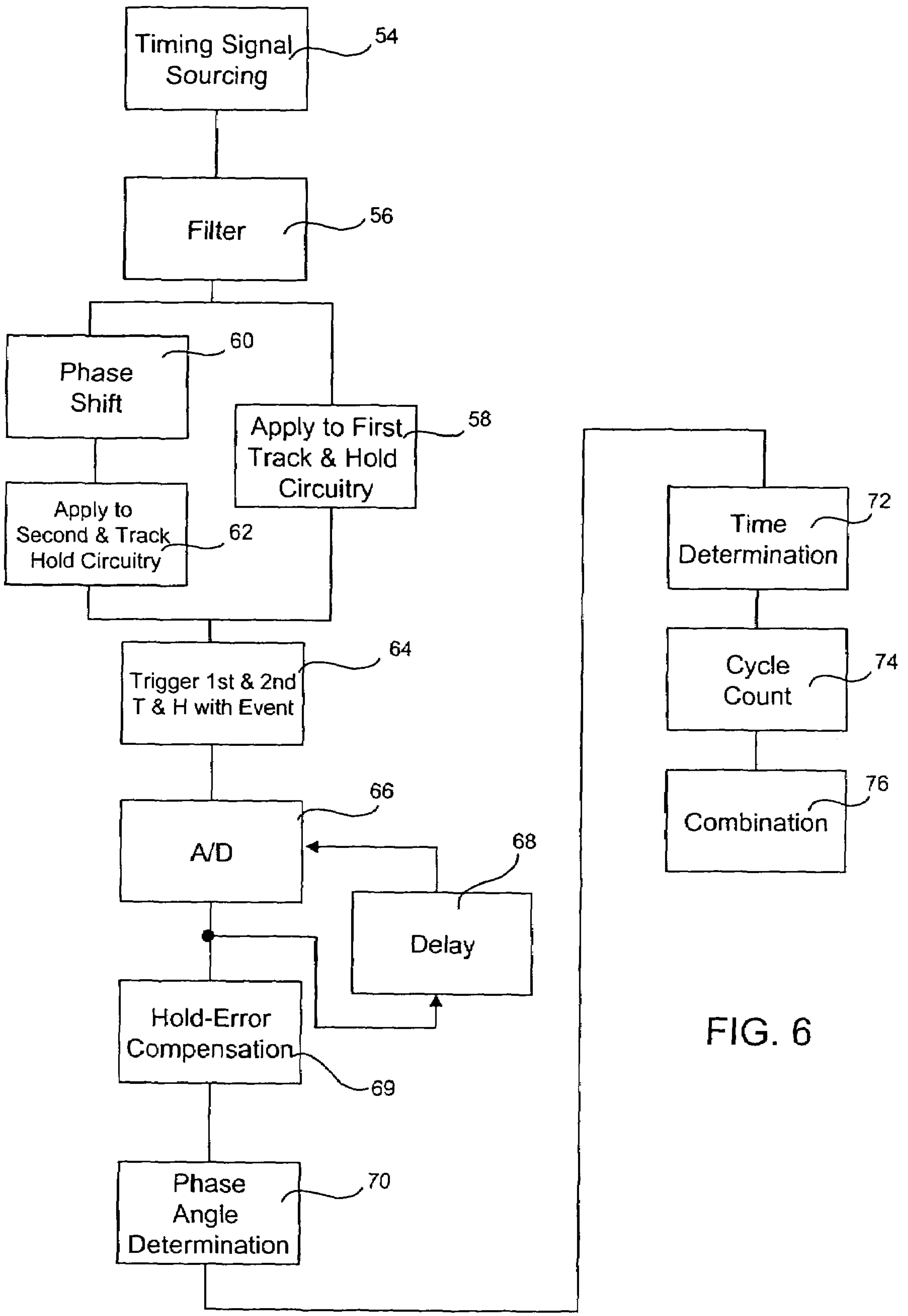
FIG. 6 is a process flow diagram of a method for time stamping an event in a signal to compensate for leakage in track and hold circuitry according to an illustrative embodiment of the present invention.

A particular method for time stamping an event according to another illustrative embodiment of the present invention is described with reference to FIG. 6. In a timing signal generating step 54, a sine wave can be generated as a first timing signal. In a filtering step 56, the sine wave can be filtered to reduce distortion, for example, by applying the sine wave to a band pass filter which removes extraneous frequency components therefrom.

In a first tracking step 58, the amplitude of the filtered sine wave can be tracked, for example, by track and hold circuitry as known in the art. In a phase shifting step 60, the phase of the filtered sine wave can be shifted by about 90 degrees. In a second tracking step 62, the amplitude of the phase shifted sine wave can be tracked, for example, by track and hold circuitry as known in the art. In a hold step 64, the amplitudes of both the sine wave and the phase shifted sine wave can be held at the time of the event being timed, for example by the track and hold circuitry that can be triggered by a signal carrying the event.

In a conversion step 66, the amplitudes of the sine wave and phase shifted sine waves that were held, can be converted to digital signals, for example using analog-to-digital conversion circuitry as known in the art. Although the particular method of this illustrative embodiment uses sine waves as first and second timing signals, it should be understood that a variety of other periodic waveforms, such as saw tooth waves, for example, may be used for timing signals within the scope of the present invention.

Persons having ordinary skill in the art should understand that track and hold circuitry can suffer some inaccuracies which can be caused, for example, by leakage in capacitive elements within the track and hold circuitry. The particular method described with respect to FIG. 6 includes steps which compensate for errors in track and hold circuitry by repeating the conversion step 66 multiple times with a delay step 68 between each iteration of the conversion step 66. The digital signals from the plurality of conversion steps 66, represent the magnitudes of the sine wave and phase shifted sine wave at the time of the event as held in the track in hold circuitry over time.

In a compensation step 69, the plurality of digital signals can be processed to determine an error trend, such as decaying output from the track and hold circuitry. In the compensation step 69, knowledge of the trend can be used to extrapolate the sine wave magnitude and phase shifted sine wave magnitude that would have been reported by track and hold circuitry if there had been no error trend. Such extrapolation is particularly useful to improve accuracy, for example, because an event may occur at some time between cycles of the analog to digital conversion circuitry. The extrapolated magnitudes can be used in a phase detection step 70 to determine the phase of the sine wave and/or of the phase shifted sine wave at the time of the event as described hereinbefore with reference to FIG. 5. The plurality of digital signals to be processed for the compensation step 69 can be provided by analog to digital conversion circuitry, for example.

In an illustrative embodiment, analog to digital conversion circuitry converts amplitudes from a sine wave and a phase shifted sine wave from track and hold circuitry to digital values at a maximum conversion rate inherent to the analog to digital conversion circuitry. A maximum number of digital samples of the sine wave magnitude and shifted sine wave magnitude for each event can thereby be provided to the processing circuitry. An error trend such as a decaying output from the track and hold circuitry will eventually fall below a noise level after which no useful information will provided for the event. In the illustrative embodiment, each output of the analog to digital conversion circuitry from the time of the event until the output falls below a predetermined noise level is collected by the processing circuitry to be used in determining the error trend.

Figure 5:
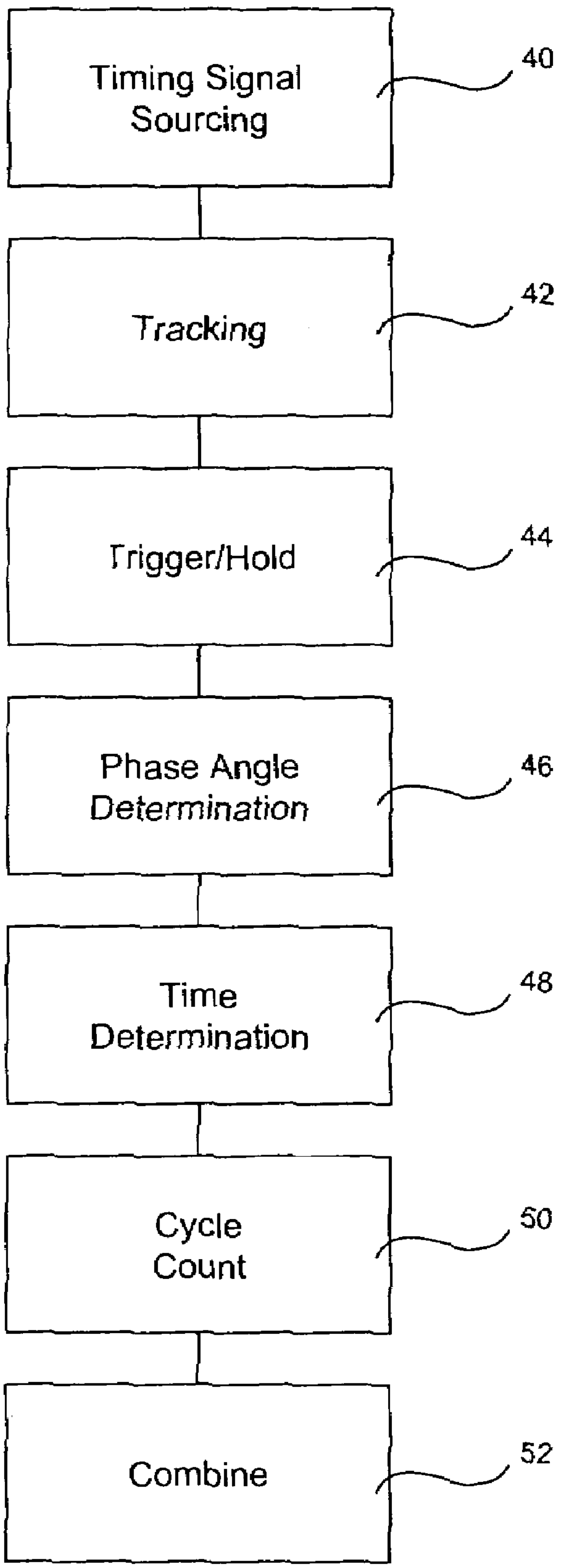
FIG. 5 is process flow diagram of a method for time stamping an event in a signal according to an illustrative embodiment of the present invention.

A time determination step 72, a cycle count step 74 and a combination step 76 can be then performed as described hereinbefore with respect to the time determination step 48, cycle count step 50 and combination step 52 of FIG. 5.

Although illustrative embodiments of the present invention are described which use a pair of timing signals to provide a 1:1 signal space to time relationship, persons having ordinary skill in the art should understand that other methods can be envisioned to achieve a direct signal to time relationship from which intra-period timing may be extracted within the scope of the present invention.

Figure 7:
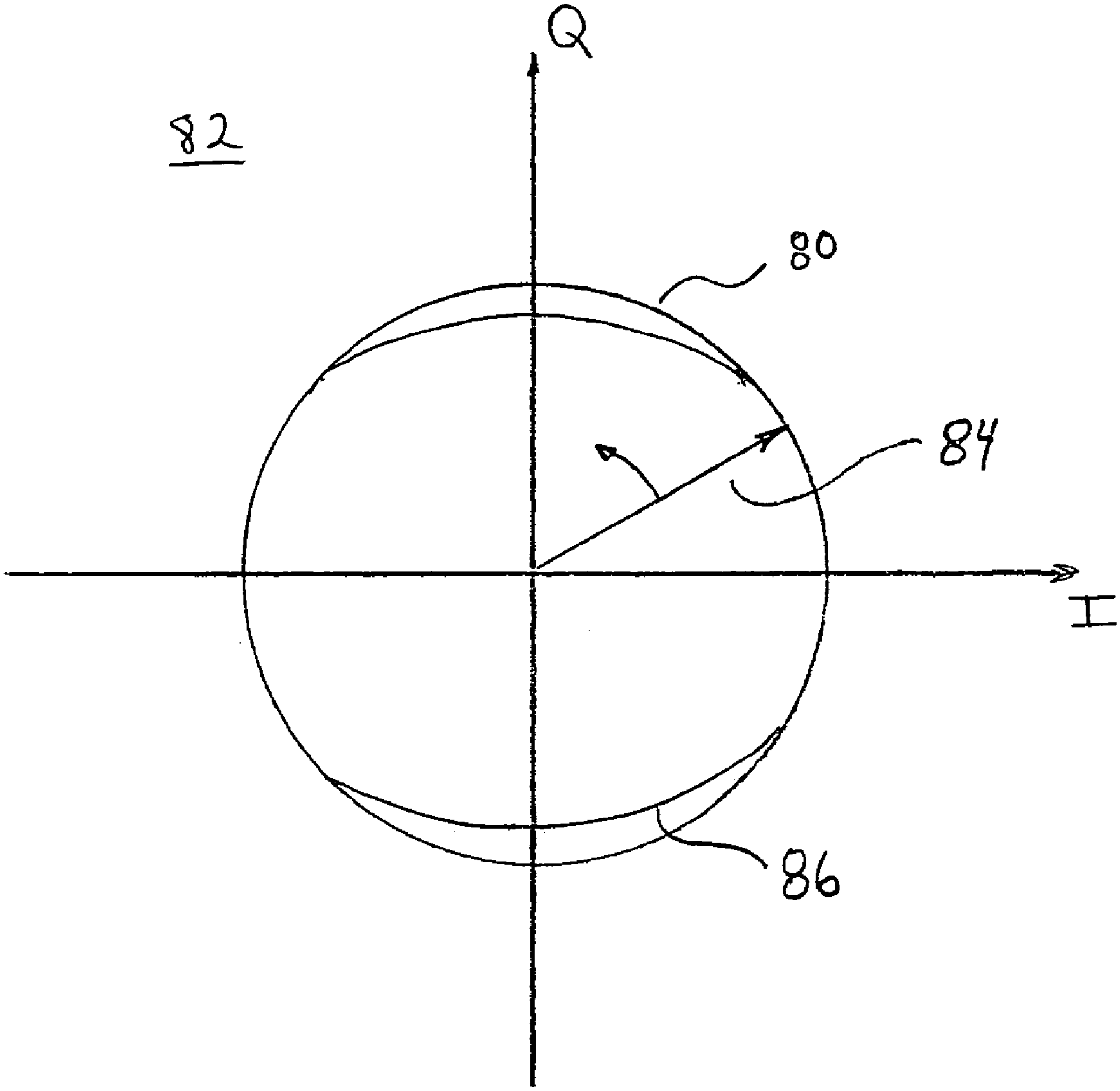
FIG. 7 is a representation of timing signals in a complex plane according to illustrative embodiments of the present invention.

Waveforms such as sine waves that are used as timing signals in illustrative embodiments of the present invention can be represented as circle 80 in the complex plane 82 that are defined by phasors 84 rotating with the frequency of the sine waves as illustrated in FIG. 7. Coordinates on the circle represent the magnitude and phase angle of the sine wave at times within a cycle of a timing signal and can be used instead of a phase angle to determine the time of an event within the cycle of the timing signal. However, sine waves used in practice are not mathematically ideal and therefore are not precisely represented by a circle or a rotating phasor. Rather, certain distorted sine waves can be represented in the complex plane by a distorted curve 86 resembling an ellipse or a compressed circle. Furthermore, distortion causes a phasor representation of a sine wave to rotate in the complex plane with an inconsistent angular frequency. Accordingly, knowledge of a phase angle of the distorted timing signal at the time of an event may not provide accurate timing information.

Illustrative embodiments of the present invention can be used to precisely determine the time of an event without relying on the phase angle of timing signals by correlating the time of an event to coordinates of the distorted timing signals in the complex plane at the time of an event. A direct relationship between the complex coordinates of the distorted timing signal and the time of the event within a cycle of the timing signal can be provided by a look-up table, or may be determined using mathematical formulae.

In an illustrative embodiment, the relationship between the complex coordinates and the timing event are empirically determined for a pair of distorted timing signals, for example, by successively determining a phase angle and magnitude of the distorted timing signals for a plurality of events A curve 86 representing the distorted timing signals can then be mapped to a look-up table or modeled mathematically. In an illustrative embodiment, a plurality of points on the curve can be empirically determined and the curve 86 can be interpolated between them. This curve 86 can be used by the processing circuitry to determine the precise time of an event within a cycle of a distorted timing signal.

Although illustrative embodiments of the present invention are described generally in terms of electronic signals, persons having ordinary skill in the art should understand that embodiments of the present invention can also be used to time stamp non-electronic signals without departing from the spirit and scope of the present invention. For example it is envisioned that photonic signals, power signals and even mechanical signals such as pneumatic system signals or hydraulic system signals can be time stamped within the scope of the present inventions.

Accordingly, illustrative embodiments of the present invention provide a time stamping method and apparatus with resolution that is not limited by the period of a tester clock. Determination of the phase angle and/or complex coordinated of a timing signal at the time an event occurs according to illustrative embodiments of the invention allows determination of a precise event time within a timing signal cycle. This precise time can be added to a time computed from a timing signal cycle count to determine precise event time relative to a counter starting time.

It should be understood that various modifications may be made to the embodiments disclosed herein. Therefore, the above description should not be construed as limiting, but merely as exemplification of the various embodiments. Those skilled in the art will envision other modifications within the scope of the claims appended hereto.

The invention claimed is:

1. A method for determining a time of an event, comprising;

empirically determining a direct relationship between complex coordinates of a pair of timing signals and the time of an event, wherein at least one of the timing signals is distorted;

acquiring an amplitude of each of a plurality of timing signals at the time of the event, wherein at east two of the timing signals are out of phase with each other; and determining from the empirically determined relationship the time of the event within a cycle of at least one of the timing signals as a function of the amplitudes of the at least two of the timing signals.

2. The method according to claim 1, wherein the act of empirically determining the direct relationship comprises determining a phase angle and magnitude of the timing signals successively for each of a plurality of different events.

3. The method according to claim 1, further comprising:

counting cycles of at least one of the timing signals from a start time to determine a cycle count;

multiplying a period of the at least one of the timing signals by the cycle count to determine a reference time for the event; and adding the reference time to the time of the event within the cycle to determine a time of the event from the start time.

4. The method according to claim 1, wherein the at least two of the timing signals are about 90 degrees out of phase with each other.

5. The method according to claim 1, further comprising generating the at least two of the timing signals by generating a first timing signal and generating a phase shifted copy of the first timing signal.

6. The method according to claim 1, wherein the at least two of the timing signals are periodic signals having the same frequency.

7. The method according to claim 1, further comprising:

tracking the amplitude of the at least two of the timing signals by applying the at least two of the timing signals to track and hold circuitry;

determining leakage in the track and hold circuitry by taking a plurality of readings from the track and hold circuitry and determining a leakage curve;

compensating for the leakage by extrapolating timing signal amplitude values in the leakage curve; and determining the time of the event within the cycle as a function of the extrapolated timing signal amplitude values.

8. The method according to claim 7, further comprising converting the amplitude from an analog value to a digital value repetitively from the time of the event until the amplitude falls below a predetermined level to determine the leakage curve.

9. The method according to claim 1, further comprising applying at least one of the timing signals to a band pass filter to reduce distortion of the timing signals prior to acquiring the amplitude of each of the timing signals.

10. The method according to claim 1, further comprising:

converting the amplitude from an analog value to a digital value; and processing the digital value to determine the time of the event within the cycle of the at least one of the timing signals.

11. The method according to claim 1, further comprising:

determining a phase angle of the at least one of the timing signals as a function of the amplitudes of the at least two of the timing signals; and determining the time of the event within th cycle of at least one of the timing signals as a function of the phase angle of the at least one of the timing signals.

12. The method according to claim 1, further comprising:

determining coordinates of the at least one of the timing signals in a complex plane as a function of the amplitudes of the at least two of the timing signals; and determining the time of the event within the cycle of at least one of the timing signals as a function of the coordinates of the at least one of the timing signals.

13. A method for determining a time of an event, comprising:

acquiring an amplitude of each of a plurality of timing signals at the time of the event wherein at least two of the timing signals are out of phase with each other;

determining the time of the event within a cycle of at least one of the timing signals as a function of the amplitudes of the at least two of the timing signals;

tracking the amplitude of the at least two of the timing signals by applying the at least two of the timing signals to track and hold circuitry;

determining leakage in the track and hold circuitry by taking a plurality of readings from the track and hold circuitry and determining a leakage curve;

compensating for the leakage by extrapolating timing signal amplitude values in the leakage curve; and determining the time of the event within the cycle as a function of the extrapolated timing signal amplitude values.

14. The method according to claim 13, further comprising converting the amplitude from an analog value to a digital value repetitively from the time of the event until the amplitude falls below a predetermined level to determine the leakage curve.

15. The method according to claim 13, wherein the time of the event is determined as a function of complex coordinates of the at least two of the timing signals.

16. The method according to claim 13, further comprising:

counting cycles of at least one of the timing signals from a start time to determine a cycle count;

multiplying a period of the at least one of the timing signals by the cycle count to determine a reference time for the event; and adding the reference time to the time of the event within the cycle to determine a time of the event from the start time.

17. The method according to claim 13, wherein the at least two of the timing signals are about 90 degrees out of phase with each other.

18. The method according to claim 13, further comprising generating the at least two of the timing signals by generating a first timing signal and generating a phase shifted copy of the first timing signal.

19. The method according to claim 13, wherein the at least two of the timing signals ar periodic signals having the same frequency.

20. The method according to claim 13, further comprising applying at least one of the timing signals to a band pass filter to reduce distortion of the timing signals prior to acquiring the amplitude of each of the timing signals.

21. The method according to claim 13, further comprising:

converting the amplitude from an analog value to a digital value; and processing the digital value to determine the time of the event within the cycle of the at least one of the timing signals.

22. The method according to claim 13, further comprising:

determining a phase angle of the at least one of the timing signals as a function of the amplitudes of the at least two of the timing signals; and determining the time of the event within the cycle of at least one of the timing signals as a function of the phase angle of the at least one of the timing signals.

23. The method according to claim 13, further comprising:

determining coordinates of the at least one of the timing signals in a complex plane as a function of the amplitudes of the at least two of the timing signals; and determining the time of the event within the cycle of at least one of the timing signals as a function of the coordinates of the at least one of the timing signals.

* * * * *